United States Patent [19]
Garcia-Ortiz

[11] Patent Number: 6,072,697
[45] Date of Patent: Jun. 6, 2000

[54] MODULAR HEAT SINK STACK

[75] Inventor: Asdrubal Garcia-Ortiz, St. Louis County, Mo.

[73] Assignee: Systems & Electronics, Inc., St. Louis, Mo.

[21] Appl. No.: 09/115,202

[22] Filed: Jul. 15, 1998

[51] Int. Cl.[7] ...................................................... H05K 7/20
[52] U.S. Cl. ........................... 361/704; 165/46; 174/16.3; 361/689
[58] Field of Search ........................... 165/46, 80.2, 80.3, 165/80.4, 185; 174/16.3; 361/688–690, 699, 704, 707–711, 717–721, 736, 796

[56] References Cited

PUBLICATIONS

Parvus Corporation, "Making Our World Easier to Control—Products Catalog," Making Our World Easier to Control, No Date.
Aavid Thermal Technologies, Inc., "Fluorinert Liquid Heat Sink Technical Description and Application Data" No Date.
Rick Lehrbaum, "Designing with PC/104—A Tutorial," Designing with PC/104—A Tutorial, ( Oct. 15, 1995).
Parsapour, "Convection Cooling In Small Terminals" IBM Tech Ditl. Bull, vol. 24, No. 2., Jul. 1981.

*Primary Examiner*—Gregory Thompson
*Attorney, Agent, or Firm*—Polster, Lieder, Woodruff & Lucchesi L.C.

[57] ABSTRACT

Heat sink apparatus (100) for use in an enclosure (12) in which electrical component; installed on circuits boards (42, 44, 48, 50) are mounted in the enclosure in a stacked arrangement (30) with the components in proximity to each other. Heat conductive plates (102) are also formed in a stacked arrangement and are inserted between adjacent circuit boards in an interdigitated manner for heat generated by the components to be conducted away from the components by the plates. A plurality of pouches (106, 116) containing a liquid heat sink material or surface comformable, conductive elastomer pads are inserted between each side of each heat conductive plates and the printed circuit boards, and between sidewalls (51, 52, 18) of the enclosure and the stack of heat conductive plates. The heat sink apparatus (100) increases the efficiency of heat transfer away from the components so to prevent the components from overheating by providing a heat conduction, transfer path from the components (118) to the enclosure (12).

21 Claims, 4 Drawing Sheets

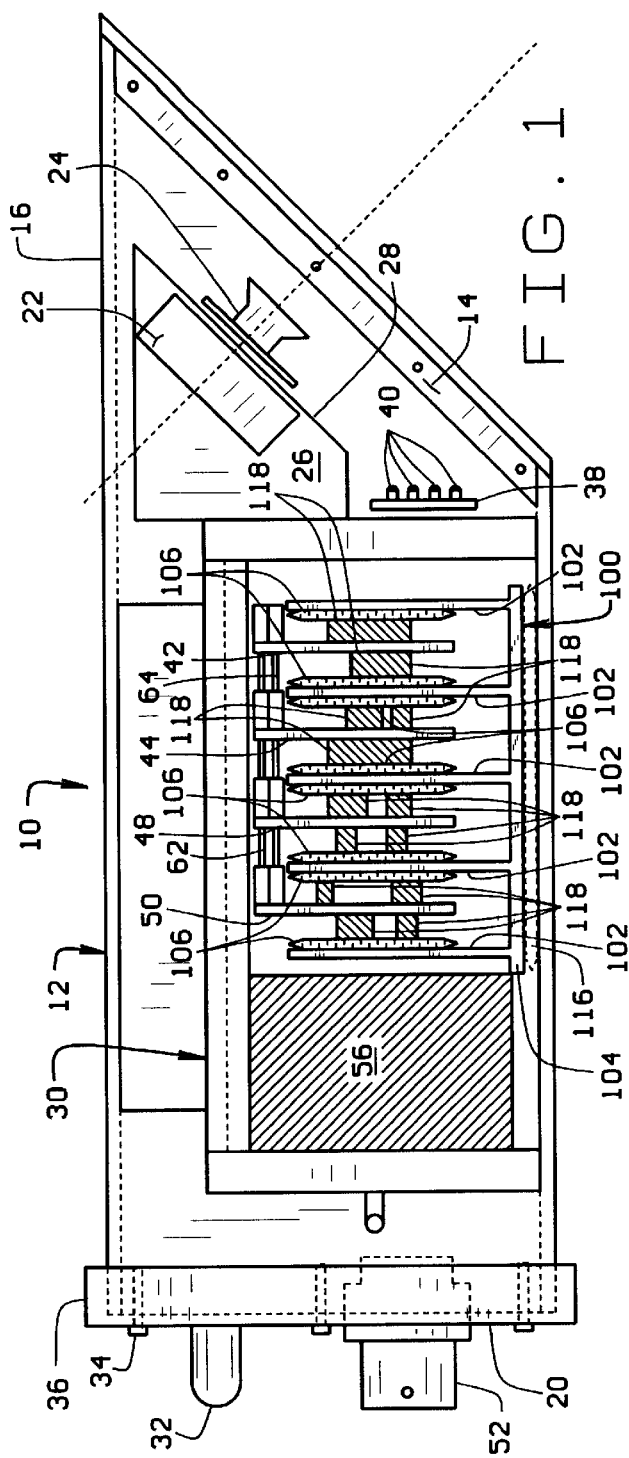
FIG. 1
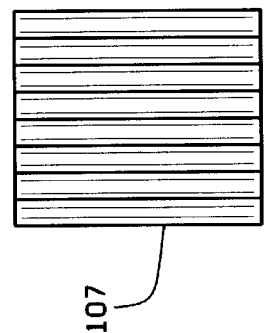
FIG. 8B
FIG. 8A
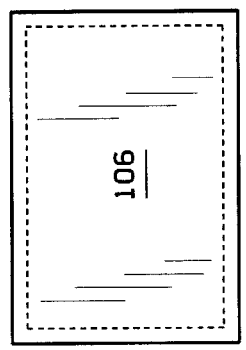
FIG. 7

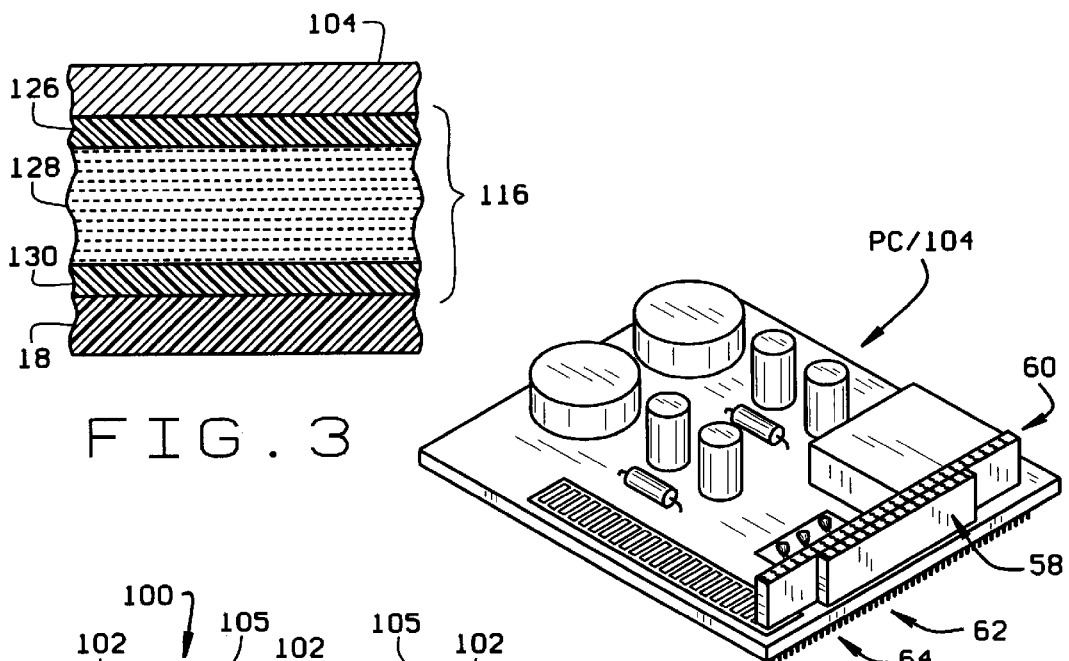
FIG. 3
FIG. 2
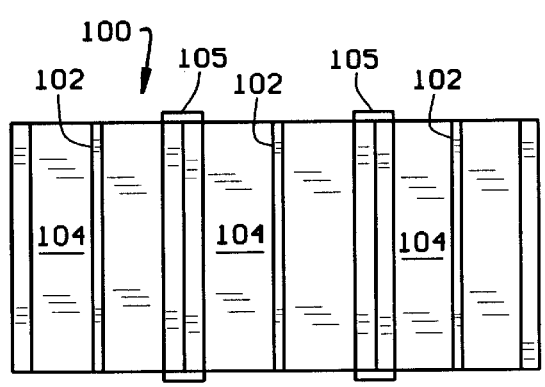
FIG. 6A
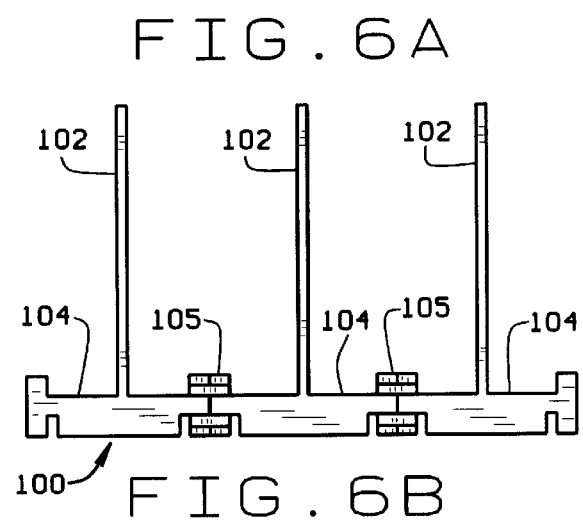
FIG. 6B
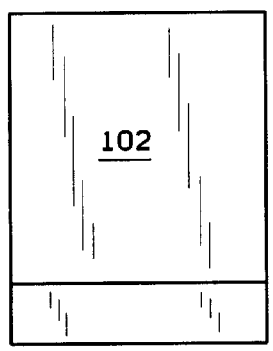
FIG. 6C

MODULAR HEAT SINK STACK

STATEMENT REGARDING FEDERALLY SPONSORED RESEARCH OR DEVELOPMENT

Not applicable.

CROSS-REFERENCE TO RELATED APPLICATIONS

D/N 5903,6545

BACKGROUND OF THE INVENTION

This invention relates to heat dissipation in a housing containing electronic circuitry, and more particularly, to an improved heat sink arrangement used with printed circuit boards mounted in close proximity to each other in an enclosed housing. It also applies to boards similarly arranged in an open air environment.

In co-pending U.S. patent application Ser. No. 08/531,467, there is described a non-imaging monitoring system which is useful, for example, in a highway traffic monitoring system. It is a feature of this system that the sensor and processing electronics are self contained in a single housing which is, for example, mounted in a relatively inaccessible location above a roadway. In co-pending U.S. patent application Ser. No. 08/965,942 there is described mounting apparatus by which a camera, printed circuit boards on which the processing electronics are installed, and ancillary components are conveniently installed in the housing, and done so in such a way as to make it easy to access and service the instrument. Because of the compactness of this equipment, the current module is approximately 18"×6"×7" in size, and a new module will be approximately 5"×5"×16", and the fact the electronics can be powered for substantial lengths of time, it is important that the heat generated by the equipment be readily and efficiently drawn away from the operating electronics and dispersed to the atmosphere. These systems are based on the use of PC/104 and PC/104-Plus form-factor, printed circuit boards assembled into a stack configuration. In this arrangement the spacing between adjacent PC boards is 0.6 inches, much less than that between components on adjacent boards. This short distance precludes the use of conventional heat sinks mounted atop the components to facilitate heat transfer away from the components. Since the enclosures are required to be sealed against the environment, forced air cooling is also precluded. Hence existing approaches to heat transfer design are inadequate for this purpose. With the approximately 40–50 watts of power consumed by the camera and processing electronics, heat build up within the housing is so great that the protective circuitry responsive to shut off the electronics in the event of a heat overload, typically will cause a shut down after only two hours of operation. It is therefore important, in order to provide equipment which can operate over prolonged periods of time, that a new heat transfer system be devised which will overcome these operational problems. This is especially important as electronic circuit density and clock speed get higher and higher.

BRIEF SUMMARY OF THE INVENTION

Among the several objects of the present invention may be noted the provision of a novel heat sink design of modular construction which is particularly useful in an enclosed housing to drain heat away from opera ting electronics installed within the housing;

the provision of such a heat sink in which components are mounted in the housing so the components face one another across an air gap, and the heat sink employs heat sink plates positioned between the components and substantially filling the air gap between them;

the provision of such a heat sink in which heat sink plates are interdigitated with the printed circuit boards on which the electronic components are mounted;

the provision of such a heat sink to employ both solid heat sink components such as the plates, and liquid heat sink (LHS) materials;

the provision of such a heat sink in which the liquid heat sink comprises a fluorine liquid encased in a pouch with the pouch being held in place adjacent electronic components by the heat sink plates;

the provision of such a heat sink to employ both solid heat sink components such as the plates, and surface conformable heat transfer materials;

the provision of such a heat sink in which the surface comfortable material comprises a heat conductive elastomer pad held in place adjacent electronic components by the heat sink plates;

the provision of such a heat sink in which liquid heat sink pouches or surface comfortable pads additionally are positioned between sidewalls of the housing and the heat sink plates for conducting heat to the atmosphere outside of the housing;

the provision of such a heat sink to efficiently direct heat away from the electronic components and do so such that the temperature within the housing continuously stays well below the level at which protective elements within the housing would shut down the electronics to protect temperature sensitive components;

the provision of such a heat sink in which heat sink plates are stacked together to form a custom heat sink, the heat sink being readily removable with the electronic components, which are also mounted in a stacked arrangement, thereby facilitating servicing of the unit in which the electronics are installed;

the provision of such a heat sink in which fins can be used for further effecting heat transfer;

the provision of such a heat sink having a base which can be formed as a slab which is then cut to size for installation into a housing; and, the provision of such a heat sink which is a low cost, yet effective way of protecting the electronic components against the effects of heat generated by their operation.

In accordance with the invention, generally stated, heat sink apparatus is for use in an application in which electrical components installed on circuits boards are mounted in a stacked arrangement with the components in proximity to each other. Heat conductive plates are also formed in a stacked arrangement that matches the circuit board arrangement, and are inserted between adjacent circuit boards in an interdigitated manner for heat generated by the components to be conducted away therefrom by the plates. A plurality of pouches containing a liquid heat sink material or surface comfortable pads are inserted between each side of one of the heat conductive plates and the electronic components mounted on an adjacent side of one of the circuit boards. The pouches and/or pads are held in place by friction with the plates and the components on the boards. Use of the pouches and/or pads increases the heat transfer efficiency of the apparatus and prevents shutdown of the components, or damage to them, resulting from overheating. Other objects and features will be in part apparent and in part pointed out hereinafter.

BRIEF DESCRIPTION OF THE SEVERAL VIEWS OF THE DRAWINGS

In the drawings, FIG. 1 is a sectional view of a housing in which a camera and components for processing images obtained by the camera are installed together with a heat sink apparatus of the present invention for draining heat away from the components to protect the components;

FIG. 2 is perspective view of a representative PC board installed in the housing;

FIG. 3 is a partial sectional view of a portion of a housing sidewall, and a portion of the heat sink apparatus including a plate and a pouch filled with a liquid heat sink material for conducting heat away from the components;

FIGS. 6A–6C illustrate a plate assembly portion of the heat sink apparatus in which FIG. 6A is a top plan view of the plate assembly, FIG. 6B a side elevational view, and FIG. 6C an end elevational view;

FIG. 7 is a plan view of a heat sink pouch; and

FIGS. 8A and 8B are respective side elevational and plan views of a surface conformable heat sink pad.

Corresponding reference characters indicate corresponding parts throughout the drawings.

DETAILED DESCRIPTION OF THE INVENTION

Figure 4:
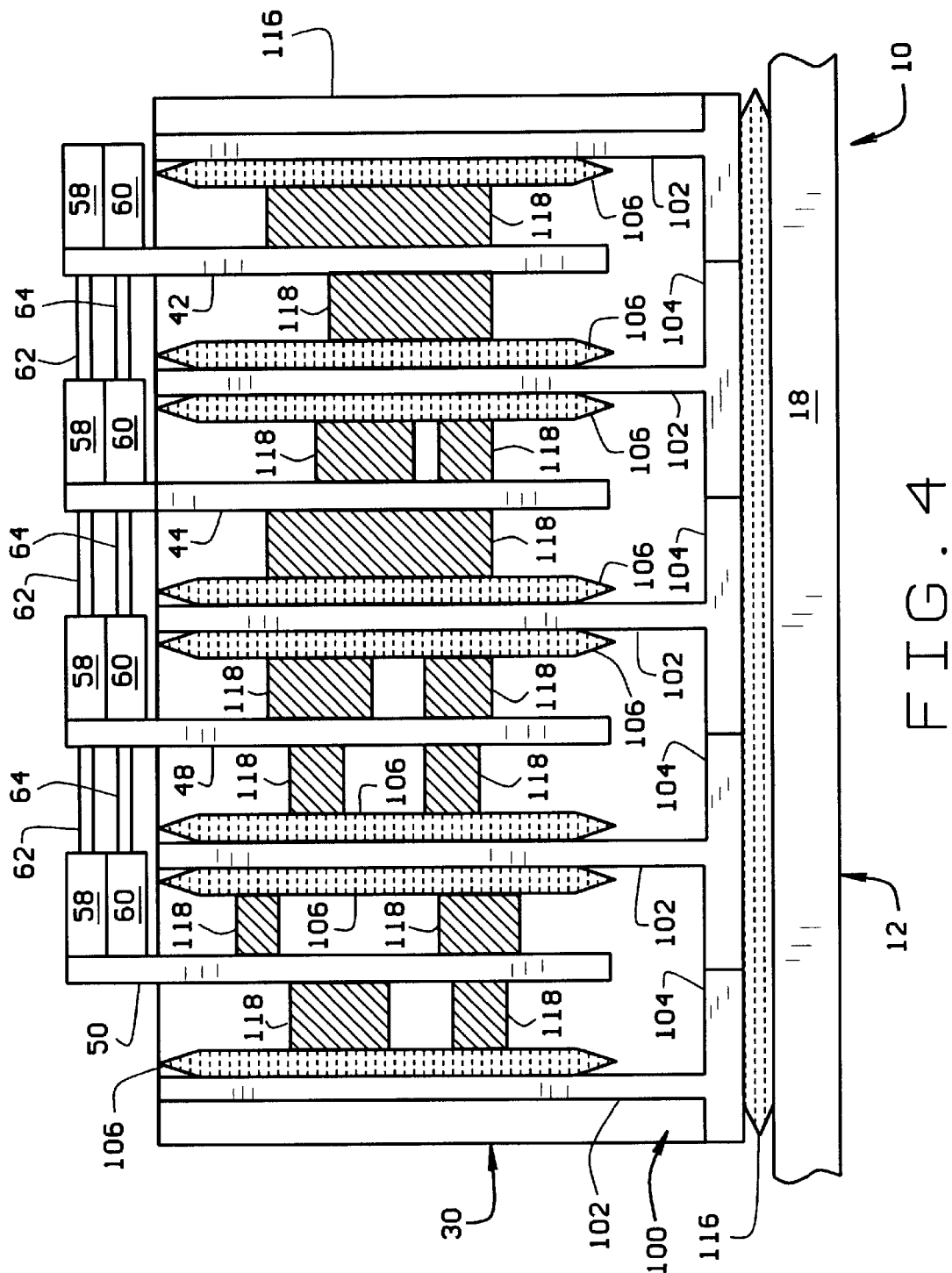
FIG. 4 is an elevational view of a component carriage installed in the housing and a first embodiment of the heat sink apparatus.

Referring to the drawings, a video sensing and monitoring system is indicated generally 10 with components of the system installed in an enclosure 12. The enclosure protects the system components from the weather, animals, birds and insects, and provides adequate cooling and heat transfer for the components so they function properly, have a long service life, and require minimal maintenance. The system is used in various video surveillance and data acquisition applications such as highway traffic monitoring.

Enclosure 12 includes a removable, beveled front plate 14 positioned at an angle with respect to an upper enclosure wall surface 16 and a lower enclosure wall surface 18. Plate 14 angles downwardly and inwardly from upper wall surface 16 to lower wall surface 18 at approximately 45°. The enclosure forms a hollow, generally rectangular (in cross-section) enclosure which is open at both ends. Plate 14 completely covers the front of enclosure 12 and a back plate 20 completely covers the rear of the enclosure. While not shown, a circumferential seal extends about an inner face of back plate 20 and the wall surface extending about the rear of the enclosure includes a mating groove (also not shown) in which the seal fits. A circumferential seal also extends about an inner face of front plate 14 and the wall surface extending about the front of the enclosure includes a mating groove in which this seal fits. As assembled, enclosure 12, with front plate 14 and back plate 20 in place, is sealed to prevent moisture, vermin, insects, etc., from entering into the interior of the enclosure where video sensing and data processing components of system 10 are housed.

System 10 includes a charged coupled device 22 operatively connected to a camera lens 24 which is secured in place by a mount 26 having an angled mounting face 28 also set at 45° so the camera angle corresponds to that of front plate 14. Mount 26 holds lens 24 in a fixed position at this angle. When front plate 14 is installed, a clear window (not shown) is in front of lens 24, allowing the camera lens a clear view of whatever system 10 is observing.

A component carriage indicated generally 30 is removably installed in enclosure 12. Back plate 20 is integrally formed with carriage 30 for the carriage to be removed from the enclosure when back plate 20 is removed. A handle 32 is attached to an outer face of the back plate to facilitate manual removal of the component carriage assembly. Back plate 20 is secured in place by screws 34 inserted through holes (not shown) in a circumferentially extending flange 36 of the component carriage and received in threaded openings in sidewalls of the enclosure.

Figure 5:
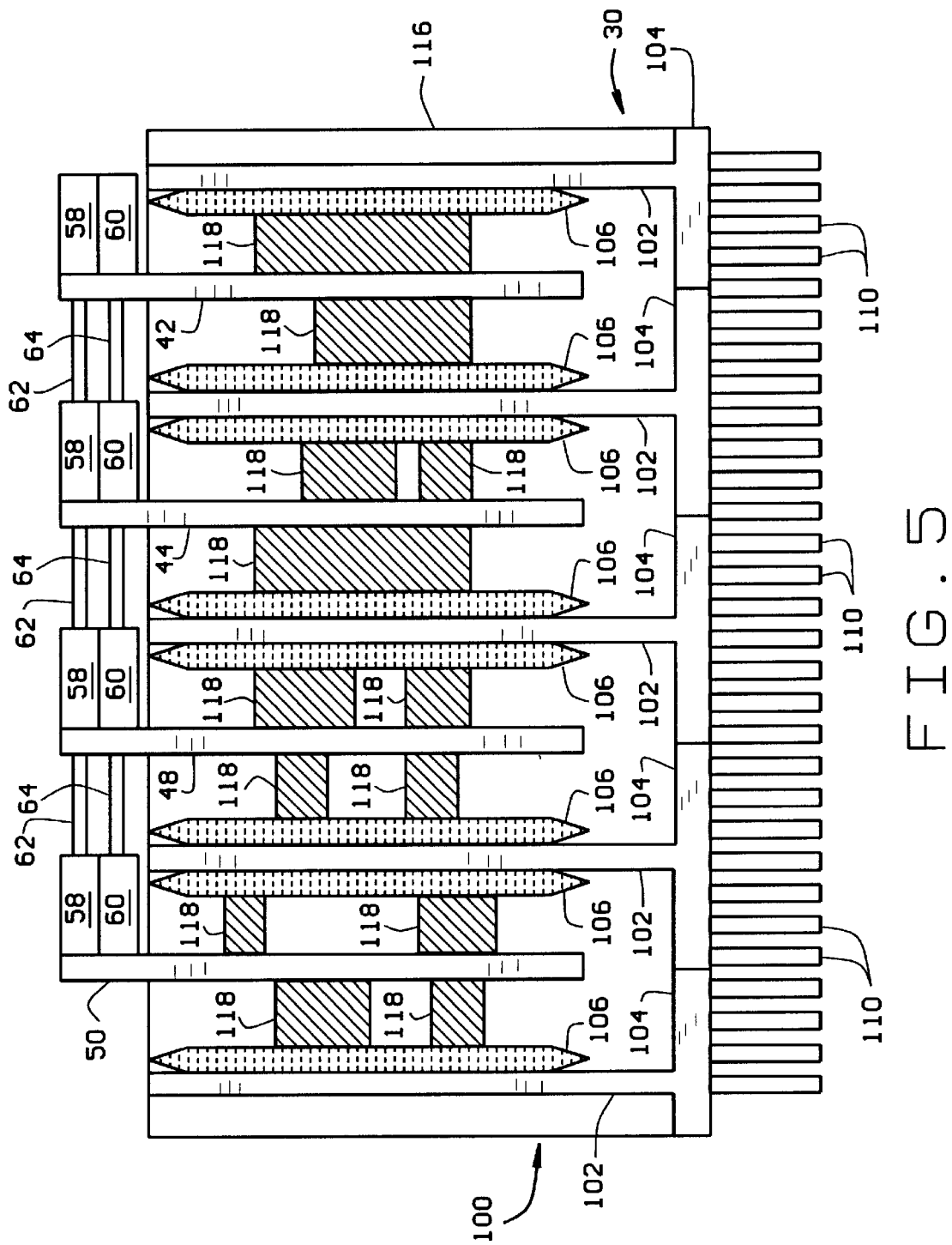
FIG. 5 is a view similar to FIG. 4 but for a second embodiment of the heat sink apparatus.

Carriage 30 houses all of the components of system 10. A LED status panel 38, attached at the front of the carriage, is visible through the window in front plate 14, and provides a visual display of the operational status of the system. Status lamps 40 on panel 38 provide a visual indication of a malfunction or system failure. A plurality of printed circuit boards are installed on carriage 30. A central processing unit (CPU) is incorporated on a first printed circuit (PC) board 42 mounted on the carriage. A storage device controller is incorporated on a second PC board 44 mounted on the carriage, the controller interfacing with a storage device incorporated on the same board. The storage device stores data; for example, as magnetic particles in a hard disk drive; or alternatively, the storage device is a solid state disk drive. Communications between system 10 and a monitoring site is by a communications device incorporated in another PC board 48. The communications device comprises a high speed modem capable of transmitting and receiving data over unmodified telephone wires at speeds of 33.6 Kilobits per second (Kbps), or a network interface card (NIC) utilizing a topology such as Ethernet 10 baseT, or 100 baseTX. Power for the system is distributed through a power distribution module installed on a PC board 50 mounted on the carriage. The central processor, hard disk controller and storage device, communication device, and power distribution module are all implemented using respective PC/104 or PC/104-Plus printed circuit cards such as shown in FIG. 2 on which various electrical and electronic components are mounted. The PC/104 cards are both compact and stackable as seen in FIGS. 1, 4, and 5. Their use enables system 10 to be implemented in a relatively small arrangement suitable for confinement within the relatively small space provided by enclosure 12. External power to the enclosure, and communication from the monitored site to a monitoring station, are through a power connector (not shown) located on back plate 20 of the enclosure, and a signal connector 52 also located on the back plate. Both connectors are sealed to NEMA 4 and ANSI C80.6 standards for electrical cable connections, and both are conventional electrical and signal cable connectors, respectively. Within enclosure 12, a power supply 56 converts 100 VAC to a DC voltage compatible with the various electronic components providing, for example, ±5 VDC and +12 VDC to the components. Power supply 56 efficiently generates these power levels without generating a large amount of heat which must be dissipated. Each PC/104 board has connectors 58, 60 for routing power and signals over respective buses 62, 64.

Because of the heat generated by the components 118 mounted on the various PC boards, rapid and efficient dissipation of heat is essential to the prolonged, proper functioning of system 10. To that end, system 10 incorporates a heat sink apparatus 100 which is mounted within enclosure 12. Apparatus 100 first includes a series of plates 102 which are inserted between adjacent PC boards as shown in FIGS. 1, 4, and 5. Each plate 102 is heat conductive and is heated by the heat generated by the components 118 on the respective PC boards, each plate functioning to conduct heat away from the PC boards and hence the components installed thereon. Each plate 102 is at most as wide as a PC board, has a height at least corresponding to the length of the PC board on which components 118 are mounted, and the plate includes a base section 104 on which plate 102 is centered and from which the plate orthogonally projects. The base sections are attachable to each other using locking members 105 so, just as the PC boards are arranged in a stacked configuration, so are the heat sink plates as seen in FIGS 6A–6C. This allows heat sink apparatus to be customized to the number of PC boards in carriage 30. Alternately, base 104 can be formed as a slab which is cut to size for installation into enclosure 12, with the plates 102 being separately attachable to the base rather than the plate and base being of a one-piece construction as shown in the drawings. When the plates are assembled with the PC boards, an interdigitated arrangement is achieved in which each PC board is positioned between two adjacent plates 102. Thus, there is a plate 102 between each PC board as well as a plate at each end of the stacked PC board arrangement. This configuration applies to any printed circuit board arrangement where the boards are closely spaced and mounted in a carriage that offers an open face that is perpendicular to the component sides of the board.

Next, a pouch 106 or pad 107 is positioned between each plate 102 and an adjacent PC board. There are two pouches 106 or pads 107 provided for each PC board so to draw heat away from the components 118 mounted on either side of a board. Each pouch 106 contains a liquid heat sink (LHS) material and is installed so as to physically contact a plate 102. The liquid heat sink material is, for example, a liquid fluorine compound. Typically, a pouch is rectangular in shape, as shown in FIG. 7, and the liquid is contained within the pouch by a seal along the periphery of the pouch as indicated by the dashed line in the Figure. Each pad 107 is constructed of a surface comformable, heat conductive, elastomer. The pad is typically rectangular in shape, as shown in FIG. 8A, and may have a ribbed cross-section, as shown in FIG. 8B, to improve surface conformity with components mounted on the board. Each pouch and/or pad has a width corresponding to that of the plate 102, and the length of each pouch and/or pad also corresponds to the length of that portion of a PC board on which components are installed. Heat generated by the components 118 on the respective PC boards is conducted through a pouch 106 or pad 107 to the plate 102 with which it is in contact. This arrangement serves to increase the efficiency of heat transfer away from the components by replacing convection cooling with conduction cooling. The plates and pouches fill the air gap between adjacent PC boards so that, in addition to drawing the heat away from the components on a board, they block any direct heat flow path between the boards. All of this serves to efficiently transfer heat away from the components and prevent damage to the components caused by overheating.

As shown in FIG. 4, in addition to the pouches and/or pads installed between the PC boards, heat sink apparatus 100 further includes additional pouches 116 installed on the sides of, or beneath, component carriage 30. In FIG. 4, a first additional pouch 116 is shown fitted beneath the bases 104 of the plates 102, so the pouch is sandwiched between the carriage assembly and bottom wall 18 of enclosure 12. This arrangement affords a heat conduction path to the much larger surface area presented by the outside periphery of enclosure 12 which enhances heat removal from components 118, but retains the ease of extraction of carriage 30 from enclosure 12. Alternatively, and as shown in FIG. 5, fins 110 are formed on the bottom of base 104 for each of the plates 102. The fins afford a much larger surface area which enhances heat removal from components 118. The fin configuration determines the thermal resistance of base 104. This alternative embodiment is used where component carriage 30 is exposed to ambient air in either a convective cooling or forced air cooling arrangement.

Heat transfer is by conduction from the components 118 to the pouches 106. From the pouches, the heat is conducted to the plates 102. From the plates, the heat is transferred through the plate bases 104 to the pouch 116 located beneath the carriage, and thence through bottom wall 18 of the enclosure to the atmosphere by convection The sectional view of FIG. 3 illustrates this latter heat transfer path. As shown in this FIG. 3, heat conducted through plate base 104 is conducted through a first sidewall 126 of pouch 116, through the heat sink material 128, and through the other sidewall 130 of the pouch, to surface 18 of enclosure 12. From here, the heat convects and radiates into the atmosphere.

What has been described is a heat sink design of modular construction particularly useful in an enclosed housing to drain heat away from operating electronics installed within the housing. The heat sink employs heat sink plates formed in a stacked arrangement that matches the circuit board arrangement and heat conductive pouches and/or pads positioned between the components on adjacent PC boards, the plates are being interdigitated with the PC boards on which the components are mounted. Pouches and/or pads are also positioned between sidewalls of the housing and the circuit boards to further help conduct heat to the outside of the housing. In another embodiment of the heat sink, fins are used to facilitate heat transfer to ambient air. The heat sink functions to efficiently direct heat away from electronic components and, as a result, the temperature within the housing stays well below the temperature level at which protective elements within the housing would shut-off the electronics to protect temperature sensitive components. The heat sink construction of the present invention provides a low cost, yet effective way of protecting the electronic components against the effects of heat generated by their operation.

In view of the foregoing, it will be seen that the several objects of the invention are achieved and other advantageous results are obtained.

As various changes could be made in the above constructions without departing from the scope of the invention, it is intended that all matter contained in the above description or shown in the accompanying drawings shall be interpreted as illustrative and not in a limiting sense.

I claim:

1. A heat sink apparatus used in an enclosure to dissipate heat generated by electrical and electronic components mounted on a plurality of printed circuit boards positioned in proximity to one another within the enclosure, the printed circuit boards being installed within sidewalls of the enclosure in a stacked configuration, the apparatus comprising:

a plurality of heat conductive plates arranged together for said plates to extend between adjacent circuit boards in an interdigitated configuration, each plate including a base with said plate projecting from said base intermediate the ends thereof, and said plates being connected together in a stacked configuration similar to the stacked configuration of printed circuit boards;

a plurality of pouches with one pouch being positioned on each side of each printed circuit board to facilitate heat transfer away from said board, each pouch containing a liquid heat sink material for heat generated by said components to be conducted through said pouch to a plate to increase the efficiency of heat transfer away from said components and prevent damage to the components caused by overheating; and, a pouch of liquid heat sink material fitted between said stacked arrangement of plates and at least one of said sidewalls of said enclosure to dissipate the heat to the atmosphere through said sidewall.

2. The apparatus of claim 1 further including a locking member for connecting the bases of adjacent bases of adjacent plates together.

3. The apparatus of claim 1 further including fins extending from the base of each said plate to dissipate the heat directly to the atmosphere through a sidewall of said enclosure.

4. In an enclosure housing electrical and electronic components mounted on a plurality of printed circuit boards installed within sidewalls of the enclosure in proximity to one another, heat sink apparatus for dissipating heat generated by the components comprising:

a heat conductive plate assembly inserted between adjacent boards, each said plate assembly including a base section and a plate extending from said base section between adjacent boards for heat generated by said components to be convected and radiated at said plates and conducted away from said components by the plates; and, a pouch positioned between each side of each plate and one of said adjacent boards, each pouch containing a liquid heat sink material absorbing the heat generated by said components and said pouch transferring said heat to its associated plate for said plate to further conduct the heat absorbed by each pouch away from said components thereby to increase the efficiency of heat transfer away from said components and prevent component damage resulting from overheating; and, a pouch of liquid heat sink material fitted between said plate assembly and at least one of said sidwalls enclosure.

5. The heat sink apparatus of claim 4 wherein said base sections of said plate assemblies are finned to enhance heat transfer to the atmosphere.

6. The heat sink apparatus of claim 5 wherein said plate assemblies are connected together for said plates to extend between adjacent circuit boards in an interdigitated configuration.

7. The heat sink apparatus of claim 6 wherein said plate assemblies are connected together in a stacked configuration similar to the stacked configuration of printed circuit boards, and the heat sink apparatus further includes a locking member for connecting adjacent plate assemblies together.

8. A heat sink structure for use in an enclosure housing electrical and electronic components mounted on a plurality of printed circuit boards installed within sidewalls of the enclosure in a stacked configuration, the heat sink structure dissipating heat generated by the components and comprising:

a plurality of heat conductive plate assemblies, each said plate assembly including a base section and a plate extending from said base section, said plate assemblies arranged together in a stacked configuration for said stack of plate assemblies to interfit with said stack of printed circuit boards with a plate to be between adjacent boards and with a plate to the outside of said boards located at each end of stack of printed circuit boards for heat generated by said components to be convected and radiated at said plates and conducted away from said components by the plates, said stack of plate assemblies and stack of printed circuit boards being fitted together in an interdigitated configuration;

a plurality of pouches each of which contains a liquid heat sink material, one of said pouches being installed between each side of each board and the plate located between adjacent boards or to the outside of the boards forming each end of said stack of boards, said pouches absorbing the heat generated by said components and said pouches transferring said heat to their associated plates for said plates to further conduct the heat absorbed by each pouch away from said components thereby to increase the efficiency of heat transfer away from said components and prevent component damage resulting from overheating; and, a pouch fitted between a base of said stack of plates and at least one of said of said enclosure to dissipate heat to the atmosphere through said sidewall.

9. The structure of claim 8 further including a locking member for connecting adjacent plate assemblies together.

10. The structure of claim 9 further including fins extending from the base of each said plate assembly to dissipate the heat directly to the atmosphere.

11. A heat transfer apparatus for dissipating heat generated by electrical and electronic components mounted on a plurality of printed circuit boards assembled into a PC/104 stack comprising:

heat conductive plates interdigitated with said printed circuit boards, said plates being heated by the heat generated by said components and conducting the heat away from said components;

a heat conductive base connected to said plates and acting as a heat sink for the heat transferred by said plates from said components;

thermal interface media fitted between said plates and said boards for heat generated by said components to be conducted through said media to said plates to increase the efficiency of heat transfer away from said components and prevent damage to the components caused by overheating; and, a thermal interface medium fitted between said base and at least one sidewall of an enclosure containing said PC/104 stack to dissipate the heat to the atmosphere through said sidewall.

12. The apparatus of claim 11 wherein said media are conformable pouches filled with a heat conductive fluid.

13. The apparatus of claim 11 wherein said media are conformable pads constructed of a heat conductive elastomer.

14. The apparatus of claim 11 wherein each plate includes said base with said plate orthogonally projecting from said base intermediate the ends thereof.

15. The apparatus of claim 14 further including a locking member for connecting the bases of adjacent plates together.

16. The apparatus of claim 11 wherein the plurality of said plates orthogonally project from said base, said plates equally spaced intermediate the ends thereof.

17. The apparatus of claim 11 wherein said thermal interface medium is a conformable pouch filled with a heat conductive fluid.

18. The apparatus of claim 11 wherein said thermal interface medium is a conformable pad constructed of a heat conductive elastomer.

19. The apparatus of claim 11 further including fins extending from said base to dissipate the heat directly to the atmosphere.

20. A modular heat sink assembly dissipating heat generated by electrical and electronic components mounted on printed circuit (PC) boards installed within an enclosure in a stacked configuration whereby as one or more additional PC boards are added to the stack, or one or more PC boards are removed from the stack, the heat sink assembly can be readily modified to effectively dissipate the heat for the number of PC boards now comprising the stack, the assembly comprising:

- a plurality of interconnecting heat conductive plate assemblies each of which includes a base section and a plate extending from said base section, said plate being inserted between adjacent PC boards for heat generated by said components to be directed at said plate and conducted away from said components by said plate; and,
- a pouch positioned between each side of a plate and one of the adjacent PC boards between which the plate is inserted, each pouch containing a liquid heat sink material absorbing heat generated by said components and said pouch transferring the heat to its associated plate for said plate to further conduct the heat absorbed by each pouch away from said components thereby to increase the efficiency of heat transfer away from said components and prevent component damage resulting from overheating;
- an additional heat conductive plate assembly being interconnected with the current heat plate assemblies when a new PC board is added to the stack, and additional pouches being positioned between each side of a plate and one of the adjacent PC boards between which the plate is inserted, or one of the heat conductive plate assemblies being removed, together with one or more of the pouches when a PC board is removed from the stack.

21. The modular heat sink assembly of claim 20 wherein said enclosure has sidewalls defining the enclosure and said modular heat sink assembly further includes a pouch of liquid heat sink material fitted between said interconnected heat conductive plate assemblies and at least one sidewall of said enclosure.

* * * * *

UNITED STATES PATENT AND TRADEMARK OFFICE
CERTIFICATE OF CORRECTION

PATENT NO.   : 6,072,697
DATED        : June 6, 2000
INVENTOR(S)  : Asdrubal Garcia-Ortiz It is certified that error appears in the above-identified patent and that said Letters Patent is hereby corrected as shown below:

Column 7,
Line 43, after "at least one of said sidewalls", add -- of said enclosure --

Column 8,
Line 21, after "plates and at least one of said", add -- sidewalls --

Signed and Sealed this

Seventh Day of August, 2001

*Attest:*

*Attesting Officer*

NICHOLAS P. GODICI
*Acting Director of the United States Patent and Trademark Office*